United States Patent [19]

Kaneko et al.

[11] Patent Number: 4,835,038
[45] Date of Patent: May 30, 1989

[54] SUBSTRATE COATED WITH MULTIPLE THICK FILMS

[75] Inventors: Tsuneo Kaneko; Shiro Ezaki, both of Yokohama, Japan

[73] Assignee: Kabushiki Kaisha Toshiba, Kawasaki, Japan

[21] Appl. No.: 153,432

[22] Filed: Feb. 8, 1988

Related U.S. Application Data

[63] Continuation of Ser. No. 878,594, Jun. 26, 1986, abandoned.

[30] Foreign Application Priority Data

Jun. 29, 1985 [JP] Japan .................. 60-143758
Jul. 29, 1985 [JP] Japan .................. 60-167235

[51] Int. Cl.$^4$ .................. B32B 3/00; B32B 17/06
[52] U.S. Cl. .................. 428/209; 428/210; 428/426; 428/432; 428/701; 428/901; 156/89; 174/68.5; 338/306
[58] Field of Search .............. 428/209, 210, 426, 432, 428/701, 901; 156/89; 174/68.5; 338/306, 307, 308

[56] References Cited

U.S. PATENT DOCUMENTS

| | | | |
|---|---|---|---|
| 3,914,514 | 10/1975 | MacKenzie et al. | 428/426 |
| 4,286,251 | 8/1981 | Howell | 338/309 |
| 4,316,942 | 2/1982 | Kuo | 428/432 |
| 4,490,429 | 12/1984 | Tosaki et al. | 428/195 |
| 4,663,215 | 5/1987 | Dubuisson et al. | 428/209 |
| 4,732,798 | 3/1988 | Ishida et al. | 428/137 |

OTHER PUBLICATIONS

DuPont's Mydas System, "DuPont Offers a New High-Yield High Performance, Thick Film Materials and Processing System", (7-84).

Primary Examiner—Ellis P. Robinson
Assistant Examiner—P. J. Ryan
Attorney, Agent, or Firm—Cushman, Darby & Cushman

[57] ABSTRACT

A substrate coated with a plurality of thick films wherein conductive layers are wholly prepared from conductive paste. The present invention offers the advantages that the drawbacks accompanying the conventional conductor of silver-palladium base are overcome by forming a resistor having a required resistivity and a high reproducibility. A conductive paste and insulative paste are fired at a lower temperature than that at which the resistor paste is fired, without reducing the adhesion strength of the conductive layer to the substrates. A low temperature melting point crystalline composition is used as an insulative layer to ensure that the resistance of the resistor is not adversely affected by repeated firings.

8 Claims, 5 Drawing Sheets

SUBSTRATE COATED WITH MULTIPLE THICK FILMS

This is a continuation of application Ser. No. 878,594, filed June 26, 1986, now abandoned.

BACKGROUND OF THE INVENTION

I. Field of the Invention:

This invention relates to a substrate coated with multiple thick films wherein conductive layers are all prepared from copper-base conductor paste.

II. Description of the Prior Art:

As is well known, a hybrid integrated circuit has come to be more widely accepted in order to reduce the weight and size of electronic appliances. Such a composite integrated circuit is constructed by soldering semiconductor elements and small electronic parts to a thick film substrate which is constructed by printing thick film conductive materials and resistive materials on an insulated substrate.

The conventional method of manufacturing such a thick film substrate comprises the steps of providing a conductive layer on an insulated substrate prepared from ceramic material. The conductive layer is formed by screen printing a conductive paste containing, for example, silver-palladium (Ag/Pd) powders and then firing the printed pattern. Later, a resistive paste containing, for example, ruthenium oxide ($RuO_2$) powder and glass frit is screen printed and then the mass is fired to provide a resistor. Last, the junction parts between the conductive layer and resistive material are radiated by YAG laser beams to trim the resistor value. To realize practical high density integration, the common practice is to build conductive layers in a multiple form with an insulation layer interposed between the adjacent conductive layers.

However, the above-mentioned conventional conductive paste of silver-palladium base has the drawbacks that the impedance is as high as 20–50 mΩ per unit area; silver migration caused by absorption of moisture tends to deteriorate electric insulation and consequently reduce reliability; and the involvement of precious metal undesirably raises the cost of the final product. Recently, therefore, it has been proposed to apply a copper-base conductive paste. This copper-base conductive paste has to be fired in an atmosphere of nitrogen gas in order to prevent the deterioration of the quality of the paste resulting from the oxidation of copper. However, the proposed copper-base conductive paste offers the advantage that it is possible to produce a conductor having an impedance as low as 2–5 mΩ per unit area at a low cost.

The aforementioned steps of producing a copper base conductive paste involves firing carried out entirely in an atmosphere of nitrogen in order to avoid the oxidation of the copper base conductive layer. To date, no material has been developed which enables a resistor having a resistance for practical application to be produced in an atmosphere of nitrogen with a high reproducibility. Therefore, the conventional process of manufacturing a substrate coated with multiple thick films involving conductive layers comprises the steps shown in FIG. 1(a) of printing a conductive paste of a silver-palladium base on an insulated substrate 11 prepared from a ceramic material such as alumina, and firing the mass in the air at a high temperature of about 850° to 900° C. to provide the underlying conductive layer 12.

Then as shown in FIG. 1(b), an insulation layer 13 prepared from an insulation paste of a high temperature melting point crystalline glass dielectric base is printed on an area defined between the underlying conductive layer 12 and the later described overlying conductive layer intersecting the underlying layer 12. Then as shown in FIG. 1(c), resistor 14 prepared from ruthenium oxide base resistive paste is printed. The above-mentioned insulation paste and resistive paste are fired at the same time in the air at a high temperature about 850° to 900° C. to provide insulation layer 13 and resistor 14. Later as shown in FIG. 1(d), a copper-base conductive paste is printed on the insulation layer 13 and contacting with resistor 14. The whole mass is fired at a temperature of about 600° to 650° C. in an atmosphere of nitrogen to provide the overlying conductor 15. Last, laser beam trimming is applied to the resistor 14 to obtain the required resistance. Throughout the above-mentioned process the copper base paste is fired at the relatively low temperature of about 600° to 650° C. in order to prevent the resistance of the previously fired resistor from significantly changing during the firing of the copper base paste.

Namely, to date, resistive paste, conductive paste of silver-palladium base, and insulative paste have all been fired in the air before the conductive paste of copper base is printed. Afterward, the conductive paste of a copper base is fired at a low temperature in an atmosphere of nitrogen gas in order to prevent the oxidation of copper and to suppress changes in the resistance of resistor 14.

However, the above-mentioned conventional process has the drawbacks that the application of a silver-palladium paste as an underlying conductor leads to the high impedance of the conductor, and the deterioration of insulation caused by the migration of silver which tends to take place when the subject multiple substrate is used under the condition of high temperature and humidity. Therefore, the underlying conductor has been applicable only as a short jumper line. Further, a substrate coated with more than three conductive layers cannot be manufactured using this process.

SUMMARY OF THE INVENTION

This invention has been accomplished in view of the above-mentioned circumstances and is intended to provide a substrate coated with multiple thick films having high electric performance and prominent reliability by preparing a conductive layer wholly from conductive paste of a copper base.

To attain the above-mentioned object, this invention provides a substrate coated with multiple thick films which is manufactured by the steps of:

printing resistive paste on an insulative substrate and firing the mass in the air to form a resistor having a predetermined resistance (first step);

printing a conductive paste of copper base on the substrate, and firing the mass at a low temperature in an atmosphere of nitrogen gas to provide an underlying conductive layer (second step);

coating the underlying conductive layer with an insulation paste prepared from a low temperature melting point crystalline glass composition (developed by the inventors for the first time), and firing the mass at a low temperature in an atmosphere of nitrogen gas to provide an insulative layer (third step);

finally printing conductive paste of copper base on the insulation layer, and firing the mass at a low temperature in an atmosphere of nitrogen gas to provide an overlying layer (fourth step); and repeatedly forming an insulative layer prepared from the aforesaid composition and a conductive layer composed of copper-base conductive paste, thereby manufacturing a substrate coated with three or more conductive layers.

In the above-mentioned case, the overlying conductive layer is fired at a lower temperature than that at which the resistor is fired. Therefore, the overlying conductive layer is likely to be insufficiently sintered, tending to be adhered to the substrate with a smaller force. When, therefore, electronic parts such as semiconductor elements and other tip-type electronic components are connected to the surface of the overlying conductive layer, the overlying conductive body is likely to peel from the substrate due to the weight of the electronic parts themselves and the effect of external forces applied thereto. Therefore, the electronic parts are connected to the underlying conductor. This underlying conductor is fired three times in total, that is, when it is fired itself, the insulation layer is fired and the overlying conductive layer is fired. Consequently, no difficulties arise from insufficient adhesion strength caused by low temperature firing.

DETAILED DESCRIPTION OF THE PREFERRED EMBODIMENTS

Figure 1A:
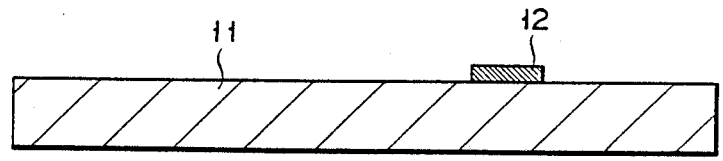
FIG. 1 indicates the sequential steps of manufacturing the conventional substrate coated with two thick conductive layers.
Figure 1B:
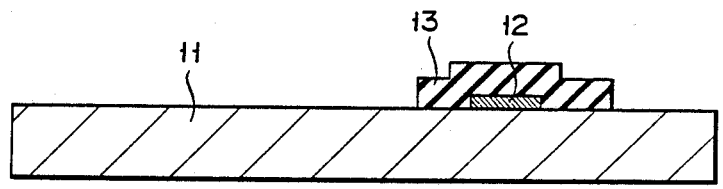
Figure 1C:
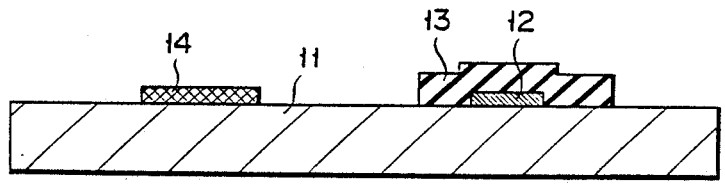
Figure 1D:
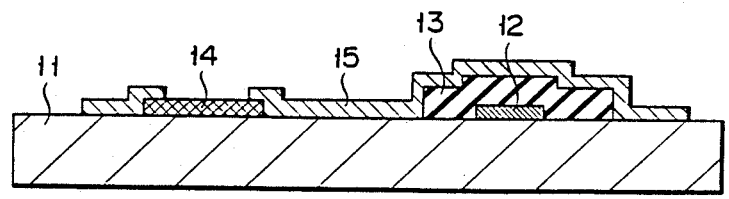
Figure 2A:
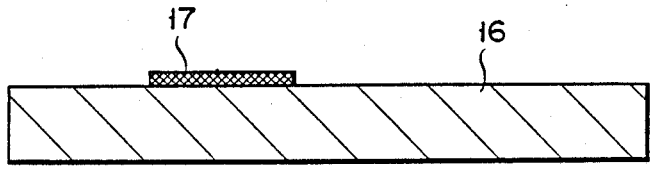
FIG. 2 shows the sequential steps of manufacturing a substrate coated with two thick conductive layers according to one embodiment of this invention.
Figure 2B:
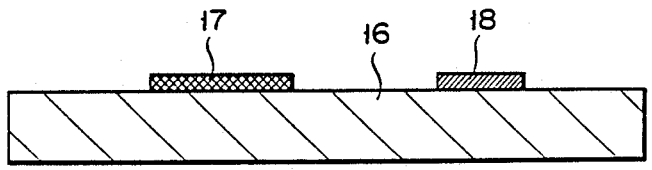
Figure 2C:
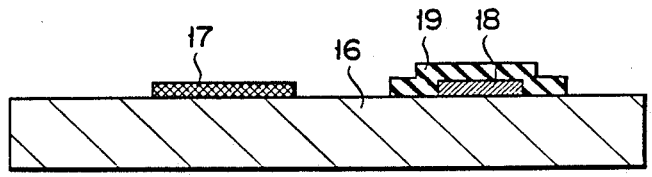
Figure 2D:
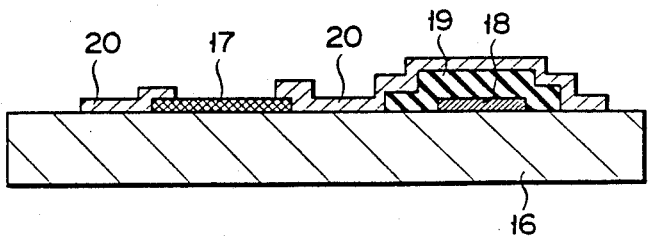

Description may now be made with reference to the accompanying drawings of a substrate, according to one embodiment of the present invention, which is coated with a plurality of thick films. Referring to FIG. 2(a), a resistive paste of ruthenium oxide base is screen printed on a ceramic substrate 16. The paste is fired at a temperature of about 850° C. in the air for about 30 minutes, thereby providing a resistor 17. Next, as shown in FIG. 2(b), a conductive paste of copper base (manufactured by Du Pont with the trademark "6001") is screen printed on the ceramic substrate 16. The paste is fired at a temperature of about 600° to 650° C. in an atmosphere of nitrogen gas to provide underlying conductor 18. Afterwards, as shown in FIG. 2(c), an insulative paste prepared from the later described low temperature melting point crystalline glass composition is screen printed on that part of the later described overlying layer which is intersected by underlying conductor 18, and fired at a temperature of about 600° to 650° C. in an atmosphere of nitrogen gas, thereby providing insulative layer 19. Thereafter, as indicated in FIG. 2(d), a conductive paste of copper base is printed so as to contact resistor 17, and also on said insulative layer 19, and is fired at a temperature of about 600° to 650° C. for about 30 minutes in an atmosphere of nitrogen gas, thereby providing overlying layer 20.

Referring to the above-mentioned manufacturing steps, it is preferred that overlying layer 20 (which is last printed and fired) be connected to resistor 17. The reason is as follows. If underlying conductor 18 is made to contact the resistor 17, as is customarily practiced in the formation of the conventional silver-palladium phase conductor, then resistivity noticeably varies as indicated by a broken line given in FIG. 3. This is because the reaction occurs at an area defined between resistor 17 and the underlying conductor 18 when firing is repeatedly undertaken at a temperature of about 600° to 650° C. for the formation of overlying and underlying layers 20, 18 and insulative layer 19. Also the temperature coefficient of the resistivity (TCR) of the resistor 17 may be noticeably deteriorated, tending to obstruct the large-scale production of the subject substrate coated with a plurality of thick films.

Figure 3:
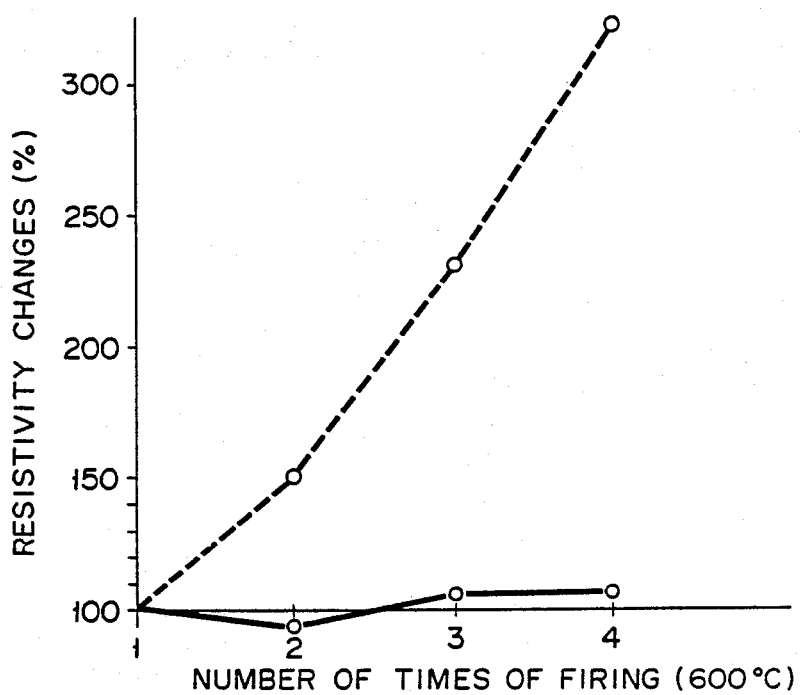
FIG. 3 graphically indicates the relationship between the number of times of firing and the corresponding changes in the resistivity.

If however overlying conductive layer 20 is connected to resistor 17, then it is possible to restrict changes in the resistivity of resistor 17 as seen from a solid line given in FIG. 3, thereby minimizing the deterioration of TCR because the resistor 17 only once contacts with the overlying layer, even if firing is repeated before the connection of overlying conductor 20 to resistor 17.

A description may now be made of the insulative paste prepared from the aforesaid low temperature melting point crystalline glass composition. The preparation comprises the steps of mixing 5 to 20% by wt (abbreviation of weight) of $SiO_2$, 45 to 60% by wt of ZnO, 15 to 30% by wt of $B_2O_3$, 0.1 to 3% by wt of $R_2O$ (one or more selected from the group consisting of $Li_2O$, $Na_2O$ and $K_2O$), 0.5 to 10% by wt of RO (at least one selected from the group consisting of MgO, CaO, BaO and SrO), 0.5 to 5% by wt of $Al_2O_3$, 0.5 to 5% by wt of $Bi_2O_3$, 0.5 to 2% by wt of F and 0.5 to 2% by wt of $SnO_2$ and further adding at least one selected from the group consisting of CoO, $P_2O_5$, $ZrO_2$, CdO and PbO to such extent that the percentages of the respective additives account for over 0.1% by wt and do not respectively exceed 2%, 2%, 5%, 5% and 3% (all by wt) at maximum. The whole mixture has to fired at a lower temperature than the crystallization temperature which is higher than 650° C. The above-mentioned process produces an insulative layer without complete crystallization, thus suppressing the occurrence of any pin holes as has been experienced in the past.

The percentages of the above-listed components have been defined for the following reasons.

$SiO_2$: If the content falls below 5% by wt, the material descreases in viscosity when melted, presenting difficulties in vitrification. Conversely, if the content increases above 20% by wt, the softening temperature rises, obstructing the firing of the material at a low temperature (600° C.).

ZnO: If the content is smaller than 45% by wt, the material will fail to be crystallized. Conversely if the content rises from 60% by wt, the crystallization temperature will fall too low.

$B_2O_3$: If the content is less than 15% by wt, the softening temperature will rise high. Conversely, if the content is more than 30% by wt, difficulties will arise in the full crystallization of the material.

$R_2O$: One or more of the group consisting of $Li_2O$, $Na_2O$ and $K_2O$ are added to accelerate the melting of glass. If, however, the total quantity of such additives exceeds 3% by wt, it will lead to a decline in insulation resistance.

RO: At least one of the group consisting of MgO, CaO, BaO and SrO is added to quicken the melting of glass. If, however, the addition is smaller than 0.5% by wt, the melting of glass fails to be effectively accelerated. Conversely, if the addition rises about 10%, the thermal expansion coefficient of the resultant mixture will be too much increased.

$Al_2O_3$: If the content is smaller than 0.5% by wt, the crystallization temperature will fall too low. Conversely, if the content rises above 5% by wt, the softening temperature of glass will rise too high.

$Bi_2O_3$: If the content is less than 0.5% by wt, the glass will fall in its wettability to an alumina substrate. Conversely, if the content rises above 5% by wt, the thermal expansion coefficient of the resultant mixture will increase too much.

F: This is added to accelerate the fusion of glass. If, however, the addition exceeds 2% by wt, the thermal expansion coefficient of the resultant mixture will become too large.

$SnO_2$: This is added to elevate the water proofness of glass. If the addition is smaller than 0.5% by wt, no noticeable effect will result. Further, even if the addition increases over 2% by wt, the effect will not be improved.

If one or more of the group consisting of CoO, $P_2O_5$, $ZrO_2$, CdO and PbO are added to an extent of more than 0.1% by wt, the addition will contribute to the maintenance of the stability of glass without deteriorating its insulation resistance. If, however, the contents of these additives increase over 2%, 2%, 5%, 5% and 3% by wt, respectively, the glass quality will become nonuniform, or the desired effect of such an addition should not be expected to rise.

Concretely, the required glass composition is composed of the components listed below in Table 1. Sample numbers 1 to 4 given in Table 1 represent low temperature melting point crystalline glass compositions. Sample number 5 denotes the conventional insulation material.

Samples of crystalline glass compositions prepared by mixing the components shown in Table 1 below in the percentages by weight inducted therein were melted into glass in a platinum crucible at a temperature of 1,300° to 1,400° C. The resultant vitrified mass was crushed and screened, and further pulverized by the wet process into particles having an average size of about 5 microns. Last, the resultant powder and a proper amount of a vehicle (consisting of ethylcellulose and terpineol) were blended to provide a glass paste.

Later, the glass paste is screen printed on the alumina substrate so as to cover a first printed and fired layer (a conductor composed of a copper base and a resistor of ruthenium oxide ($RuO_2$) base). The resultant mass is fired at a temperature of 600° C. for 10 minutes to provide an insulative layer having a thickness of about 40 microns. Last, a copper base conductor acting as a second layer is printed and fired on the insulative layer.

TABLE 1

| Composition | | 1 | 2 | 3 | 4 | 5 |
|---|---|---|---|---|---|---|
| $SiO_2$ | | 18 | 15 | 10 | 7 | 5 |
| ZnO | | 52 | 55 | 58 | 50 | 62 |
| $B_2O_3$ | | 15 | 18 | 20 | 26 | 24 |
| $Li_2O$ | | | | | | |
| $Na_2O$ | $R_2O$ | 3 | 2 | 1 | 1 | 1 |
| $K_2O$ | | | | | | |
| MgO | | | | | | |
| CaO | | | | | | |
| BaO | RO | 5 | 4 | 5 | 10 | 5 |
| SrO | | | | | | |
| $Al_2O_3$ | | 3 | 2 | 1 | 1 | 3 |
| $Bi_2O_3$ | | 2 | 1 | 2 | 1.5 | 0 |
| F | | 1 | 2 | 1 | 0.5 | |
| $SnO_2$ | | 1 | 0.5 | 1 | 2 | |
| CoO | | | 0.5 | | | |
| $P_2O_5$ | | | | 0.5 | | |
| $ZrO_2$ | | | | 0.5 | | |
| CdO | | | | | 0.5 | |
| PbO | | | | | 0.5 | |

Table 2 below shows the physical properties of the glass compositions prepared as shown above: the insulation resistance of the insulative layer, the solder wettability of the copper base conductor formed on the insulative layer, changes in the adhesion strength of the insulative layer to the alumina substrate surface and the resistivity change of the resistor.

TABLE 2

| | 1 | 2 | 3 | 4 | 5 |
|---|---|---|---|---|---|
| Softening temperature Ts (°C.) | 529 | 550 | 562 | 538 | 542 |
| Crystallization peak temperature (°C.) | 703 | 672 | 660 | 695 | 594 |
| Thermal expansion coefficient $\alpha$ (100 to 300° C.) | 57 | 56 | 58 | 64 | — |
| Insulation resistance ($\Omega$) | $10^{12}$ | $10^{12}$ | $10^{11}$ | $10^{11}$ | $10^9$ |
| Solder wettability | Good | Good | Good | Good | Bad |
| Adhesion strength to the surface of an alumina substrate | Good | Good | Good | Good | Bad |
| Percentage change in resistivity (%) | +5 | +10 | +10 | +5 | +10 |

As used herein, the insulation resistance is a value obtained when the above-mentioned glass composition was given D.C. at 50 V between the first and second conductive layers, after being held for 1,000 hours with a thermostat kept at 60° C. and constant relative humidity of 95%, with D.C. of 50 V impressed between the first and second conductive layers. The solder wettability of the copper base conductors formed on the insulative layer was determined in the following manner. Eutectic solder of Pb-Sn containing 2% of Ag was used. The conductors were immersed in the bath of solder for 3 seconds at 230° C. The conductors in which more than 90% of the area of the second conductive layer were wetted by solder were regarded as having good wettability.

The adhesion strength of the insulative layer to the alumina substrate was determined in the following manner. A lead wire was soldered to the second conductive layer. The mass was pulled in the perpendicular direction. The mass in which the alumina substrate and insulative layer were not separated from each other until a tension higher than 1 kg/mm² was applied was defined to have good adhesivity.

The percentage change in the resistivity of the resistor was determined by the following formula:

$$(R_1 - R_0)/R_0 \times 100$$

wherein
$R_0$ = the original resistivity of the resistor before the formation of an insulative layer
$R_1$ = an increase of resistivity over the original resistivity R after the formation of an insulative layer.

Figure 4:
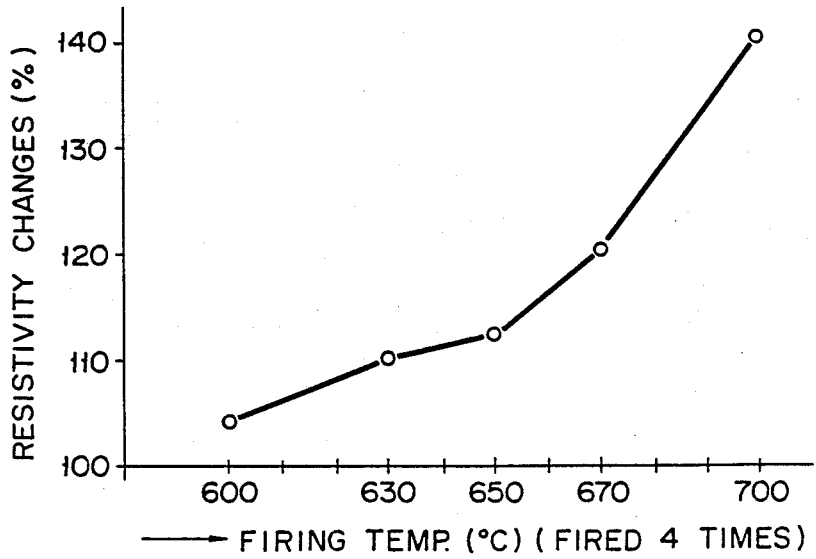
FIG. 4 graphically sets forth the relationship between the firing temperature and changes in the resistivity.

Generally accepted lead base glass having a low softening and crystallization point has the drawback that when a glass paste is fired in an atmosphere of nitrogen gas, lead is reduced and settles out, thereby deteriorating the insulation property of the insulative layer. Therefore, the present inventors have developed the aforementioned non-lead base low temperature melting point crystalline glass composition. It is advised that a glass composition mainly consisting of $ZnO$, $B_2O_5$, $SiO_2$, etc., like the proposed glass composition, be fired at a temperature more than 200° C. lower than the firing temperature of resistor 17. The reason is as follows. As seen from FIG. 4, if in the case where resistor 17 is fired at 850° C., the insulative paste would be fired at a temperature higher than 650° C. Namely, this indicates a temperature difference less than 200° C. from the firing temperature of resistor 17, even before the formation of overlying conductive layer 20. Then, repetitive firing tends to give rise to changes in the resistivity of resistor 17, as is naturally expected.

As described above, the present invention offers the advantages that it is possible to manufacture a substrate coated with a plurality of thick films, wherein the conductive layer is wholly prepared from copper-base paste, even when a conventional resistive paste is used. The conductor impedance of the substrate of the present invention falls below one-tenth of that of the conventional substrate involving a conductor of a silver-palladium base, thus enabling the conductor to be fabricated in the minutely patterned form. The copper base paste involved in the present substrate indicates far less migration than a conventional silver-palladium type, ensuring the more elevated reliability of the invention. A thick film resistor having an excellent electric property can be obtained with the high reproducibility of the required resistance, and the quantity production of a substrate coated with a plurality of thick films is realized. The insulative layer and the conductive layer are all fired in an atmosphere of nitrogen, thus realizing the fabrication of a substrate coated with three or more thick films.

Figure 5:
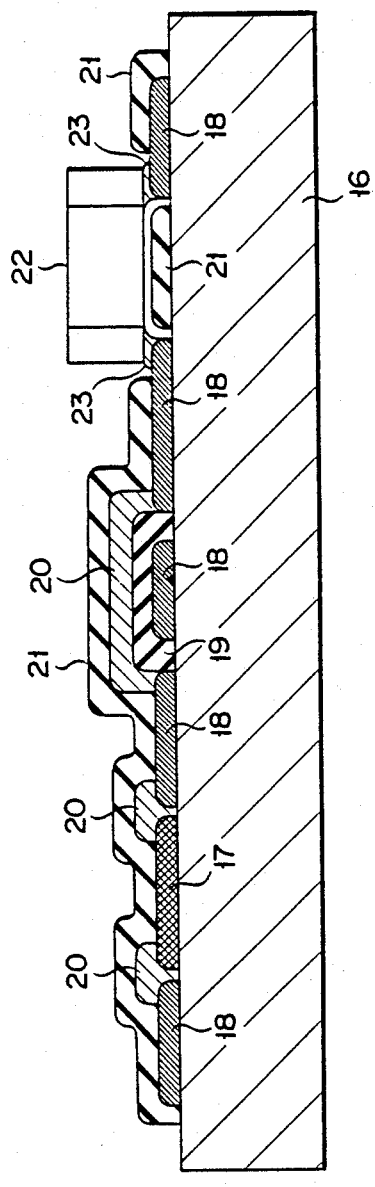
FIG. 5 illustrates a hybrid integrated circuit board constructed by connecting electronic parts to a substrate representing one embodiment of the present invention which is coated with two thick film conductive layers.

The mounting of electronic parts on the subject substrate coated with a plurality of thick films is carried out by the below mentioned steps. As shown in FIG. 5, solder resist 21 is coated on insulative substrate 16, resistive layer 17, insulative layer 19 and overlying and underlying conductors 20, 18. At this time, those parts of the underlying conductor 18 to which electronic parts are to be connected are left exposed. The solder resist 21 is prepared by screen printing silicone resin and hardening the printed impression at a temperature of 100° to 120° C. Then the chip-type electronic part 22 is connected by means of a solder 23 to the exposed parts of the underlying conductor 18. In this manner is formed an integrated circuit coated with a plurality of thick films involving a conductor paste wholly prepared from a copper base.

Resistor 17 is connected to the overlying conductor 20, the underlying conductor 18, the overlying conductor 20, and the underlying conductor 18 in the order mentioned, and last to the electronic part 22 by means of solder 23. The above-mentioned process offers the advantage that when an electronic part remote from the resistor is connected, patterning can be completed easily by means of the insulative layers, even when other conductive layers are formed midway, thereby eliminating the necessity of forming a long roundabout pattern or throughhole on the substrate.

Figure 6:
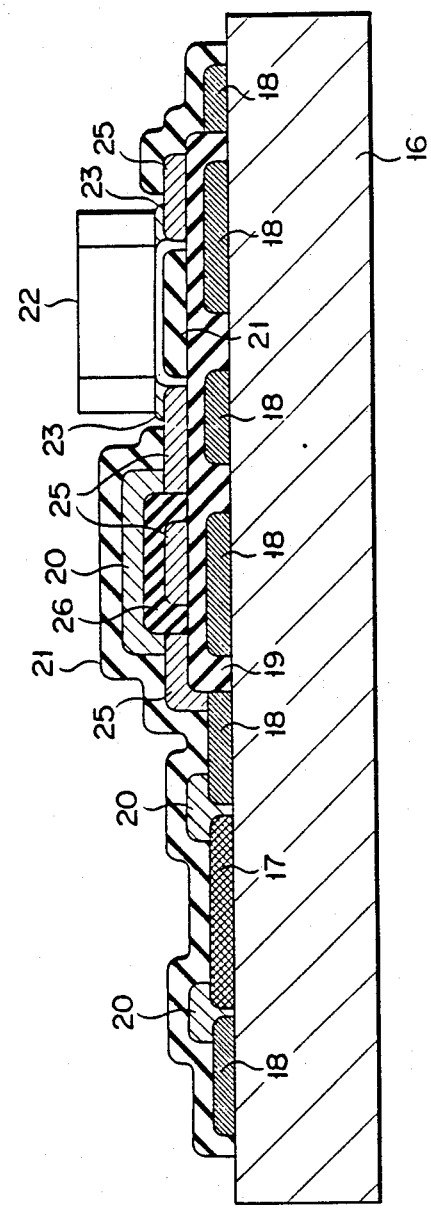
FIG. 6 sets forth a hybrid integrated circuit board constructed by connecting electronic parts to a substrate representing another embodiment of the present invention which is coated with three thick film conductive layers.

FIG. 6 illustrates an integrated circuit board coated with three thick conductive layers. Resistor 17 is connected to conductors 20, 18, 25, 20 and 25 in the order mentioned, and last to electronic part 22 by means of solder 23.

In FIG. 5, electronic part 22 is connected to underlying conductor 18, and in FIG. 6, to underlying conductor 25 by means of solder 23. The conductors 18, 25 are fired three times in total, namely when they themselves are fired, when insulative layer 19 or 26 if fired, and further when overlying conductor 20 is fired. Therefore, the conductors 18, 25 are strongly bonded to the substrate.

Figure 7:
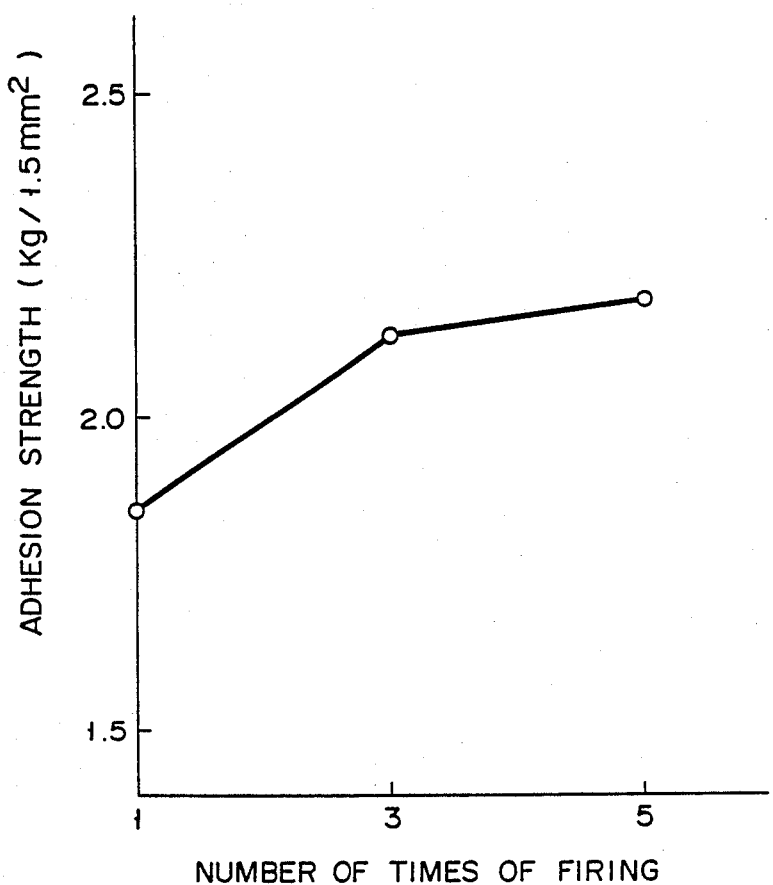
FIG. 7 graphically shows the relationship between the number of times of firing and the adhesion strength of the conductive layer on the substrate.

FIG. 7 graphically indicates that an increased number of firings elevates the adhesion strength correspondingly. With the present invention, the conductive layer is fired an odd number of times. When firing is frequently carried out from once to three times, the conductive layer immediately below the overlying conductor is connected to an electronic part, and the conductor is increased 25 to 30% in adhesion strength. When a firing frequency is increased 5 times, that is, when a conductive layer two layers below the upper most conductive layer is connected to the electronic part, the conductive layer adhesion strength is increased 30 to 35% over the case when firing takes place only once. Consequently, the present invention causes the insulative layer and conductive layer to be carried out at a low temperature throughout, after the deposition of the resistor. However, this process never leads to insufficient adhesion of the substrate to the conductive layer connecting to the electronic part.

The present invention is not limited to the aforementioned embodiments, but is also applicable for various modifications without departing from the scope and object of the invention. For instance, the above-mentioned embodiments refer to the case where the insulative layer and conductive layer are fired in an atmosphere of nitrogen. However, it is possible to use in a similar manner an inert gas such as argon or helium.

What is claimed is:
1. A substrate coated with a plurality of thick films which comprises:
    an insulative substrate;
    a resistor formed on a first portion of said substrate by firing in air;
    an underlying conductive layer of copper base formed on a second portion of said substrate by firing in a range of about 600° to 650° C. under a non-oxidizing atmosphere;
    an insulative layer formed by firing under a non-oxidizing atmosphere a crystalline glass composition in a firing range of about 529° to 650° C., said crystalline glass composition having a softening temperature in said firing range which is less than or equal to the firing temperature in said firing range at which the insulative layer is formed and a crystallization temperature which is greater than the firing temperature in said firing range at which the insulative layer is formed, said insulative layer so formed as to cover said underlying conductive layer; and an overlying conductive layer of copper base formed on said insulating layer by firing in a range of about 600° to 650° C. under a non-oxidizing atmosphere.

2. The substrate coated with a plurality of thick films according to claim 1, wherein the insulative layers such that conductive layer of copper base are alternately formed on said overlying conductive layer; and three or more conductive layers are formed in total.

3. The substrate coated with a plurality of thick films according to claim 1, wherein the overlying conductive layer is connected to said resistor to form an electrode.

4. The substrate coated with a plurality of thick films according to claim 2, wherein the uppermost conductive layer is connected to said resistor to form an electrode.

5. The substrate coated with a plurality of thick films according to claim 1, wherein said crystalline glass composition contains bismuth oxide and fluorine.

6. The substrate coated with a plurality of thick films according to claim 1, wherein said crystalline glass composition comprises:
   about 5-20% by weight of $SiO_2$;
   about 45-60% by weight of $ZnO$;
   about 15-30% by weight of $B_2O_3$;
   about 0.1-3% by weight of $R_2O$, where R is selected from the group comprising Li, Na and K;
   about 0.5-10% by weight of $XO$, where X is selected from the group comprising Mg, Ca, Ba and Sr;
   about 0.5-5% by weight of $Al_2O_3$;
   about 0.5-5% by weight of $Bi_2O_3$;
   about 0.5-2% by weight of F;
   about 0.5-2% by weight of $SnO_2$; and
   at least one selected from the group comprising about 0.1-2% by weight of $CoO$, about 0.1-2% by weight of $P_2O_5$, about 0.1-5% by weight of $ZrO_2$, about 0.1-5% by weight of $CdO$ and about 0.1-3% by weight of $PbO$.

7. A substrate coated with a plurality of thick films which comprises:
   an insulative substrate;
   a resistor formed on a first portion of said substrate by firing in air;
   an underlying conductive layer of copper base formed on a second portion of said substrate by firing in a range of about 600° to 650° C. under a non-oxidizing atmosphere;
   an insulative layer formed by firing under a non-oxidizing atmosphere a crystalline glass composition having a softening temperature in a range of about 529° to 650° C. and sinterable in a range of about 529° to 650° C., and insulative layer being formed so as to cover said underlying conductive layer; and
   an overlying conductive layer of copper base formed on said insulative layer by firing in a range of about 600° to 650° C. under a non-oxidizing atmosphere.

8. The substrate coated with a plurality of thick films according to claim 7, wherein said crystalline glass composition comprises:
   about 5-60% by weight of $SiO_2$;
   aboout 45-60% by weight of $ZnO$;
   about 15-30% by weight of $B_2O_3$;
   about 0.1-3% by weight of $R_2O$, where R is selected from the group comprising Li, Na and K;
   about 0.5-10% by weight of $XO$, where X is selected from the group comprising Mg, Ca, Ba and Sr;
   about 0.5-5% by weight of $Al_2O_3$;
   about 0.5-5% by weight of $Bi_2O_3$;
   about 0.5-2% by weight of F;
   about 0.5-2% by weight of $SnO_2$; and
   at least one selected from the group comprising about 0.1-2% by weight of $CoO$, about 0.1-2% by weight of $P_2O_5$, about 0.1-5% by weight of $ZrO_2$, about 0.1-5% by weight of $CdO$ and about 0.1-3% by weight of $PbO$.

* * * * *